(12) United States Patent
Ishizuka

(10) Patent No.: US 10,277,192 B2
(45) Date of Patent: Apr. 30, 2019

(54) PHASE SHIFTER, IMPEDANCE MATCHING CIRCUIT, AND COMMUNICATION TERMINAL APPARATUS

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 15/798,464

(22) Filed: Oct. 31, 2017

(65) Prior Publication Data

US 2018/0069524 A1  Mar. 8, 2018

Related U.S. Application Data

(63) Continuation of application No. PCT/JP2016/068339, filed on Jun. 21, 2016.

(30) Foreign Application Priority Data

Jun. 29, 2015 (JP) ................ 2015-130203

(51) Int. Cl.
*H03H 7/38* (2006.01)
*H03H 7/20* (2006.01)
*H04B 1/04* (2006.01)
*H04B 1/10* (2006.01)

(52) U.S. Cl.
CPC ............ *H03H 7/20* (2013.01); *H03H 7/38* (2013.01); *H04B 1/04* (2013.01); *H04B 1/0458* (2013.01); *H04B 1/10* (2013.01)

(58) Field of Classification Search
CPC ............ H03H 7/38; H03H 7/18; H03H 7/185; H03H 7/19; H03H 7/20; H04B 1/0458
USPC ........................................ 333/32, 138, 140
See application file for complete search history.

(56) References Cited

U.S. PATENT DOCUMENTS

| 9,106,313 B2 | 8/2015 | Ueki et al. |
| 2012/0127049 A1 | 5/2012 | Kato |
| 2014/0065980 A1 | 3/2014 | Ueki et al. |
| 2017/0117868 A1 | 4/2017 | Ishizuka et al. |

FOREIGN PATENT DOCUMENTS

| JP | 2011-244422 A | 12/2011 |
| JP | 2013-098744 A | 5/2013 |
| WO | 2012/153691 A1 | 11/2012 |
| WO | 2016/114181 A1 | 7/2016 |

OTHER PUBLICATIONS

Official Communication issued in International Patent Application No. PCT/JP2016/068339, dated Sep. 13, 2016.

*Primary Examiner* — Stephen E. Jones
(74) *Attorney, Agent, or Firm* — Keating & Bennett, LLP

(57) ABSTRACT

A phase shifter includes a transformer including a first coil, a second coil that is magnetically coupled to the first coil, and a parasitic inductance component, and an impedance adjustment circuit including a reactance element connected to the transformer. The impedance adjustment circuit includes an input/output capacitor connected between a first port and a second port of the transformer, and the input/output capacitor is defined by an inter-coil capacitance generated between the first coil and the second coil and an input/output additional capacitor connected between the first port and the second port.

20 Claims, 14 Drawing Sheets

Freq.(700MHz to 900MHz)

Freq.(1.7GHz to 2.7GHz)

Freq.(700MHz to 900MHz)

Freq.(1.7GHz to 2.7GHz)

PHASE SHIFTER, IMPEDANCE MATCHING CIRCUIT, AND COMMUNICATION TERMINAL APPARATUS

CROSS REFERENCE TO RELATED APPLICATIONS

This application claims the benefit of priority to Japanese Patent Application No. 2015-130203 filed on Jun. 29, 2015 and is a Continuation Application of PCT Application No. PCT/JP2016/068339 filed on Jun. 21, 2016. The entire contents of each application are hereby incorporated herein by reference.

BACKGROUND OF THE INVENTION

1. Field of the Invention

The present invention relates to a phase shifter provided in a high-frequency circuit, and particularly, to a phase shifter that changes the phase in accordance with the frequency band. The present invention also relates to an impedance matching circuit, and particularly, to an impedance matching circuit including a phase shifter. The present invention further relates to a communication terminal apparatus including the phase shifter or the impedance matching circuit.

2. Description of the Related Art

In general, in a high-frequency circuit, a phase shifter may be used for impedance matching. In the related art, the phase shifter may be of a high-pass-filter type or a low-pass-filter type, and a circuit constant is determined so as to obtain a desired phase-shift amount at a desired frequency. For example, a phase shifter including a high-pass-filter-type circuit and a low-pass-filter-type circuit is disclosed in Japanese Unexamined Patent Application Publication No. 2013-98744.

In communication terminal apparatuses, such as a cellular phone terminal, for example, impedance matching is often necessary in a plurality of frequency bands. Considering the case where, as illustrated in FIG. 20, a phase shifter 73 is provided between an impedance matching circuit 72 and a second high-frequency circuit 74 and, where impedance matching is performed between a first high-frequency circuit 71 and the second high-frequency circuit 74 using the phase shifter 73 and the impedance matching circuit 72, for example, the phase shifter is required to have a phase-shift characteristic in accordance with a frequency band in order to perform impedance matching in a plurality of frequency bands.

For example, if impedance matching is performed in both the low band and the high band, it may be necessary to largely change the phase of one of the bands while the phase of the other band is not significantly shifted. The following two phase-shift operations might be required, for example.

(1) The phase of a high-band signal is shifted while the phase of a low-band signal is not shifted.

For example, the pass phase of the low-band signal is about 0° (or about 180°), and the pass phase of the high-band signal is about 90°.

(2) The phase of a low-band signal is shifted while the phase of a high-band signal is not shifted.

For example, the pass phase of the low-band signal is about 90°, and the pass phase of the high-band signal is about 0° or about 180°.

Note that in FIG. 20, since the reflected wave from the second high-frequency circuit 74 makes a round trip in the phase shifter 73 when viewed from the impedance matching circuit 72, the phase-shift amount of the reflected signal in the phase shifter 73 is doubled. That is, a phase-shift amount of 90° is necessary in order to obtain a reflected phase of 180°, and a phase-shift amount of 0° or 180° is necessary in order to obtain a reflected phase of 0°.

However, as described below, the related art has not provided a phase shifter that enables phase-shift operations for each frequency band described in the above (1) and (2).

For example, FIG. 17 illustrates an example of a phase-frequency characteristic of a high-pass-filter-type phase shifter illustrated in FIG. 16A. In this example, the phase-shift amount in a low band (700 MHz band: Marker M1) can be 90°, but the phase-shift amount in a high band (2 GHz band: Marker M2) is 30°, not 0°. In addition, FIG. 18 illustrates an example of a phase-frequency characteristic of a low-pass-filter-type phase shifter illustrated in FIG. 16B. In this example, the phase-shift amount in a low band (700 MHz band: Marker M01) can be −90°, but the phase-shift amount in a high band (2 GHz band: Marker M02) is about 100°, not 180°. Furthermore, in both of the low band and the high band, the change in the phase-shift amount in the frequency band is large.

FIG. 19 illustrates an example of an insertion-loss characteristic with respect to the phase of the high-pass-filter-type phase shifter illustrated in FIG. 16A. Since the phase-shift amount is 180° around the cutoff frequency (lower than or equal to 1 GHz), the insertion loss is increased if the phase-shift amount is increased. In addition, in the low-pass-filter-type phase shifter illustrated in FIG. 16B, if a phase-shift amount of about 180° is obtained in a low band, the cutoff frequency is decreased, and the insertion loss in a high band is excessively increased.

As described above, in the filter-type phase shifters of the related art, it has not been possible to perform phase-shift operations for each frequency band described in the above (1) and (2).

SUMMARY OF THE INVENTION

Preferred embodiments of the present invention provide phase shifters that are able to shift a phase in accordance with a frequency band, and impedance matching circuits and communication terminal apparatuses each including a phase shifter.

A phase shifter according to a preferred embodiment of the present invention includes a transformer connected between a first port and a second port and including a first coil, a second coil that is magnetically coupled to the first coil, and a parasitic inductance component, and an impedance adjustment circuit including a reactance element connected to the transformer, wherein a coupling coefficient between the first coil and the second coil of the transformer and a value of the reactance element in the impedance adjustment circuit are set such that a phase-shift amount changes in accordance with a frequency band, and the impedance adjustment circuit includes an input/output capacitor connected between the first port and the second port of the transformer, the input/output capacitor being defined by an inter-coil capacitance generated between the first coil and the second coil and an input/output additional capacitor connected between the first port and the second port.

With this configuration combined with, for example, an impedance matching circuit, it becomes easy to perform impedance matching in accordance with the frequency band. In addition, the input/output capacitor is defined by the inter-coil capacitance generated between the first coil and the second coil and the input/output additional capacitor connected between the first port and the second port. Therefore, even if the distance between the first coil and the second coil is relatively large, the input/output capacitor is able to have a predetermined capacitance value, and a phase-shift characteristic with respect to the frequency is able to be determined with a high degree of freedom.

In a phase shifter according to a preferred embodiment of the present invention, it is preferable that the coupling coefficient between the first coil and the second coil is less than or equal to about 0.9. If the coupling coefficient between the first coil and the second coil is less than or equal to about 0.9, since the distance between the first coil and the second coil is relatively large, the inter-coil capacitance generated between the first coil and the second coil is decreased. However, with the presence of the input/output additional capacitor, the input/output capacitor is able to easily have a predetermined capacitance value.

In a phase shifter according to a preferred embodiment of the present invention, it is preferable that the transformer includes an insulating base and includes a first input/output electrode defining the first port, a second input/output electrode defining the second port, a ground electrode, a first coil conductor pattern, and a second coil conductor pattern that are provided on the insulating base, the first coil conductor pattern defining the first coil includes a first end that is connected to the first input/output electrode and a second end that is connected to the ground electrode, the second coil conductor pattern defining the second coil includes a first end that is connected to the second input/output electrode and a second end that is connected to the ground electrode, and that the input/output additional capacitor is provided on the insulating base and includes a first capacitor electrode that generates a capacitance between the first coil conductor pattern and the second input/output electrode.

With this configuration, the input/output additional capacitor is provided on a single insulating base together with the transformer, and accordingly, a compact phase shifter with a simple structure is provided.

In a phase shifter according to a preferred embodiment of the present invention, it is preferable that at least one of the first coil conductor pattern and the second coil conductor pattern is a helical coil conductor pattern including a plurality of turns, that a coil opening surface of the first coil conductor pattern on the second end side is opposed to a coil opening surface of the second coil conductor pattern on the second end side, and that the first capacitor electrode is disposed in an opposing arrangement at a position close to the first end of the first coil conductor pattern.

With this configuration, the coupling coefficient between the first coil and the second coil is prevented from being excessively large. As the coupling coefficient is increased, the phase-shift amount is increased. As the capacitance of the input/output capacitor is increased, the phase-shift amount is decreased. However, with the above-described configuration, the coupling coefficient is prevented from being excessively large, and because of the input/output additional capacitor, a predetermined phase shift amount is able to be set.

In a phase shifter according to a preferred embodiment of the present invention, it is preferable that the input/output additional capacitor is provided on the insulating base, that a second capacitor electrode that generates a capacitance between the second coil conductor pattern and the first input/output electrode is further included, and that the second capacitor electrode be disposed in an opposing manner at a position close to the first end of the second coil conductor pattern. With this configuration, the capacitance produced by the first capacitor electrode and the second capacitor electrode is connected in parallel, and the inductance produced by the first capacitor electrode and the second capacitor electrode is connected in parallel. Thus, the ESL (equivalent series inductance) to obtain a predetermined capacitor is decreased.

In a phase shifter according to a preferred embodiment of the present invention, it is preferable that the second capacitor electrode is provided along the second coil conductor pattern. Thus, the magnetic coupling between the first coil and the second coil is unlikely to be reduced or prevented.

In a phase shifter according to a preferred embodiment of the present invention, it is preferable that the first capacitor electrode is provided along the first coil conductor pattern. Thus, the magnetic coupling between the first coil and the second coil is unlikely to be reduced or prevented.

In a phase shifter according to a preferred embodiment of the present invention, it is preferable that an input capacitor connected between the first port of the transformer and a ground is provided, and that the input capacitor is provided on the insulating base, connected to the ground electrode, and defined by an input capacitor electrode that generates a capacitance between the input capacitor electrode and the first coil conductor pattern and a capacitance generated in the first coil conductor pattern. Thus, the input capacitor is provided on the single insulating base together with the transformer, and accordingly, a compact phase shifter with a simple structure is provided.

In a phase shifter according to a preferred embodiment of the present invention, it is preferable that an output capacitor connected between the second port of the transformer and the ground is provided, and that the output capacitor is provided on the insulating base, connected to the ground terminal, and defined by an output capacitor electrode that generates a capacitance between the output capacitor electrode and the second coil conductor pattern and a capacitance generated in the second coil conductor pattern. Thus, the output capacitor is provided on the single insulating base together with the transformer, and accordingly, a compact phase shifter with a simple structure is provided.

In a phase shifter according to a preferred embodiment of the present invention, it is preferable that the insulating base is a multilayer body including a plurality of insulating layers that are stacked, and that a coil axis direction of the first coil conductor pattern and the second coil conductor pattern extends in a direction of the stacking. With the above configuration, a compact phase shifter is provided.

An impedance matching circuit according to a preferred embodiment of the present invention includes a phase shifter according to a preferred embodiment of the present invention and an impedance matching circuit portion that is connected in series to the phase shifter, wherein the impedance matching circuit portion is a circuit providing impedance matching of impedance whose phase has been shifted by the phase shifter.

In an impedance matching circuit according to a preferred embodiment of the present invention, it is preferable that the phase shifter moves impedance in a low band to a second quadrant or a third quadrant on a Smith chart, and that the impedance matching circuit portion moves both impedance in a high band and the impedance in the low band towards a center of the Smith chart.

With the configuration described above, it becomes easy to perform impedance matching in accordance with the frequency band.

A communication terminal apparatus according to a preferred embodiment of the present invention includes a feeder circuit and an antenna connected to the feeder circuit, wherein, between the feeder circuit and the antenna, a phase shifter according to a preferred embodiment of the present invention or an impedance matching circuit according to a preferred embodiment of the present invention is provided. Thus, a communication terminal apparatus in which the phase is shifted in accordance with the frequency band and impedance matching is performed between an antenna element and the feeder circuit in a wide band is obtained.

According to various preferred embodiments of the present invention, phase shifters in which the phase-shift amount in accordance with the frequency band is determined are provided. In addition, impedance matching circuits with which impedance matching is able to be easily performed for each frequency band are provided. In addition, communication terminal apparatuses in which impedance matching is performed between an antenna element and a feeder circuit for each predetermined frequency band are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
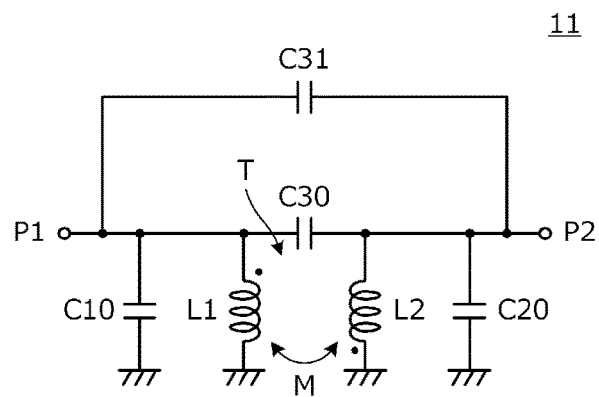
FIG. 1 is a circuit diagram of a phase shifter 11 according to a first preferred embodiment of the present invention.

Hereinafter, a plurality of preferred embodiments of the present invention will be described with reference to specific examples and the drawings. In the drawings, like numerals denote like components. In a second preferred embodiment and the following preferred embodiments, portions that are common to those in the first preferred embodiment will be omitted from the description, and different portions will be described. In particular, like functions and effects obtained by like configurations will not be referred to in each of the preferred embodiments.

First Preferred Embodiment

FIG. 1 is a circuit diagram of a phase shifter 11 according to the first preferred embodiment of the present invention. The phase shifter 11 includes a transformer T connected between a first port P1 and a second port P2. The transformer T includes a first coil L1 and a second coil L2 that is magnetically coupled to the first coil L1 with a coupling coefficient of less than about 1. The phase shifter 11 further includes an impedance adjustment circuit including reactance elements connected to the transformer T. The impedance adjustment circuit includes a first coil capacitor C10, a second coil capacitor C20, an inter-coil capacitance C30, and an input/output additional capacitor C31.

In FIG. 1, the first coil capacitor C10 and the second coil capacitor C20 are each represented as a lumped element. The first coil capacitor C10 is connected in parallel to the first coil L1, and the second coil capacitor C20 is connected in parallel to the second coil L2. The inter-coil capacitance C30 is also represented as a lumped element. The inter-coil capacitance C30 is connected between the first coil L1 and the second coil L2.

In FIG. 1, the input/output additional capacitor C31 is connected between the first port P1 and the second port P2. Therefore, the configuration is such that an input/output capacitor that is a parallel connection circuit including the inter-coil capacitance C30 and the input/output additional capacitor C31 is connected between the first port P1 and the second port P2.

Figure 2A:
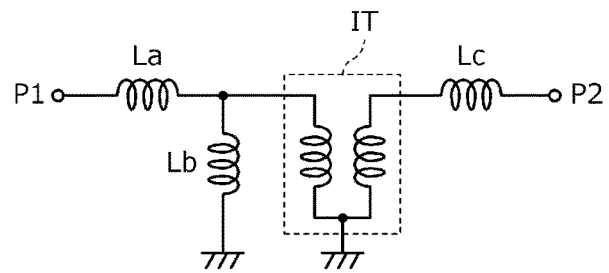
FIGS. 2A and 2B are equivalent circuit diagrams of a transformer T.
Figure 2B:
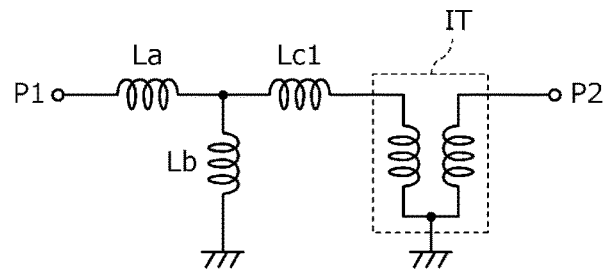

FIGS. 2A and 2B are equivalent circuit diagrams of the above transformer T. The equivalent circuit of the transformer T may be represented in several ways. FIG. 2A illustrates an ideal transformer IT, a series parasitic inductance component La that is connected in series to the upstream side of the ideal transformer IT, a parallel parasitic inductance component Lb that is connected in shunt (parallel) to the upstream side of the ideal transformer IT, and a series parasitic inductance component Lc that is connected in series to the downstream side of the ideal transformer IT.

FIG. 2B illustrates the ideal transformer IT, two series parasitic inductance components, the series parasitic inductance component La and a series parasitic inductance component Lc1, which are connected in series to the upstream side of the ideal transformer IT, and the parallel parasitic inductance component Lb that is connected in shunt (parallel) to the upstream side of the ideal transformer IT.

In the transformer T according to the present preferred embodiment, since the coupling coefficient k between the first coil L1 and the second coil L2 is less than about 1, the above series parasitic inductance components and parallel parasitic inductance component are generated.

Figure 3:
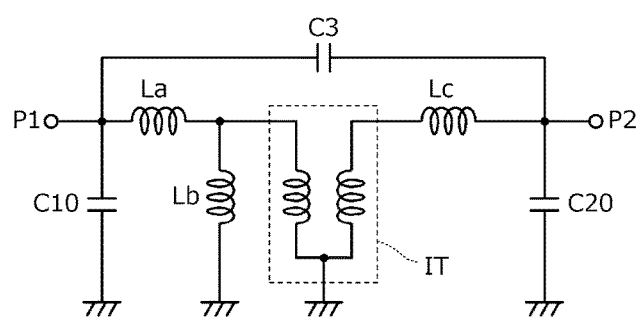
FIG. 3 is an equivalent circuit diagram of the phase shifter 11 separately illustrating an ideal transformer IT and parasitic inductance components (series parasitic inductance components La and Lc and a parallel parasitic inductance component Lb).

FIG. 3 is an equivalent circuit diagram of the phase shifter 11 separately illustrating the ideal transformer IT and the parasitic inductance components (the series parasitic inductance components La and Lc and the parallel parasitic inductance component Lb). Here, an input/output capacitor C3 represents both of the inter-coil capacitance C30 and the input/output additional capacitor C31 as a single lumped element.

Although the parasitic inductance components (inductors La, Lb, and Lc) cause the inductance of the transformer to deviate from a defined value (e.g., about 50Ω), the first coil capacitor C10, the second coil capacitor C20, and the input/output capacitor C3 adjust the impedance of the transformer to a defined value. In particular, the first coil capacitor C10 and the second coil capacitor C20 act so as to correct the deviation of the impedance due to the parallel parasitic inductance component Lb, and the input/output capacitor C3 acts so as to correct the deviation of the impedance due to the series parasitic inductance components La and Lc.

The smaller the coupling coefficient between the first coil L1 and the second coil L2, the larger the series parasitic inductance component Lc. If the coupling coefficient is less than or equal to about 0.9 (preferably less than or equal to about 0.8), in particular, it becomes easier to adjust the phase on the high band side because of the series parasitic inductance components La and Lc, whereas it is necessary to correct the deviation of the impedance. If the distance between the coils is increased to decrease the coupling coefficient, the inter-coil capacitance C30 is accordingly decreased. However, in the present preferred embodiment, since the input/output capacitor C3 has a large predetermined capacitance, the impedance matching is reliably performed. In addition, as the capacitance of the input/output capacitor C3 is increased, high band signals pass through the input/output capacitor C3 at a higher ratio, and the phase-shift function of the transformer is decreased. On the other hand, the amount of low band signals that bypasses the input/output capacitor C3 is relatively small, and the phase-shift function of the transformer is activated. Note that since the coupling coefficient between the first coil L1 and the second coil L2 is small, the phase-shift amount is smaller than about 180°. In the present preferred embodiment, the coupling coefficient is preferably set to a relatively small value (e.g., less than or equal to about 0.7 and greater than or equal to about 0.6) such that the phase-shift amount with respect to a low band signal becomes approximately 90°, for example.

Figure 4:
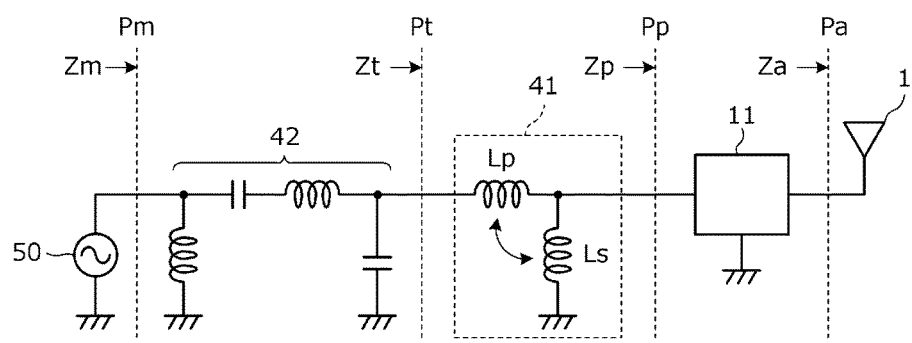
FIG. 4 illustrates a configuration of an antenna circuit including the phase shifter 11 and an antenna 1.

FIG. 4 illustrates a configuration of an antenna circuit including the phase shifter 11 and an antenna 1. This antenna circuit includes impedance matching circuit portions 41 and 42 and the phase shifter 11 provided between a feeder circuit 50 and the antenna 1. In FIG. 4, the impedance matching circuit portions 41 and 42 and the phase shifter 11 are each an example of an "impedance matching circuit portion".

In FIG. 4, the phase shifter 11 shifts the phase of a reflected signal from the antenna 1 viewed from the position denoted by Pa. The impedance matching circuit portion 41 defines an impedance conversion circuit by using a transformer. For example, the impedance matching circuit portion 41 increases an impedance Zt viewed from the position denoted by Pt to be higher than an impedance Zp viewed from the position denoted by Pp toward the antenna 1. The impedance matching circuit portions 41 and 42 perform impedance matching between the feeder circuit 50 and the antenna 1.

Figure 5:
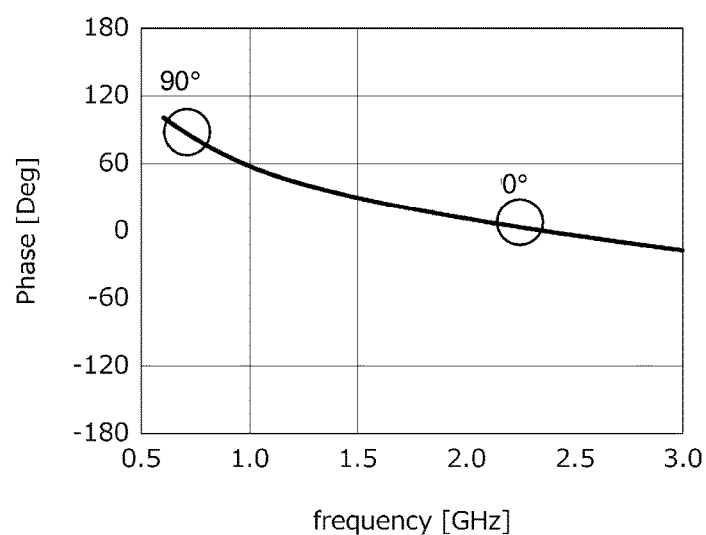
FIG. 5 illustrates a phase-shift-amount-frequency characteristic of the phase shifter 11 according to a preferred embodiment of the present invention.

FIG. 5 illustrates a phase-shift-amount-frequency characteristic of the phase shifter 11 according to the present preferred embodiment. In this example, preferably, the phase-shift amount in a low band (about 700 MHz to about 900 MHz band) is approximately 90°, and the phase-shift amount in a high band (about 1.7 GHz to about 2.7 GHz band) is approximately 0°, for example. That is, the present preferred embodiment illustrates an example of a phase shifter that does "not shift the phase of a high-band signal but shifts the phase of a low-band signal".

Figure 6A:
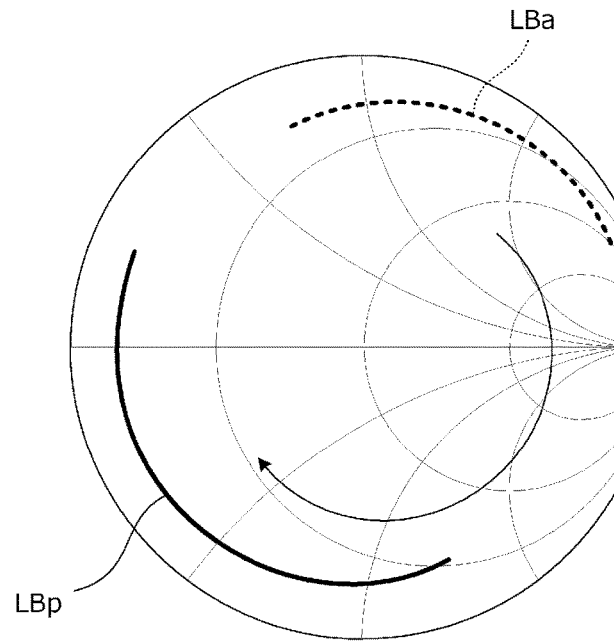
FIGS. 6A and 6B illustrate a phase-shift function of the phase shifter 11 illustrated in FIG. 4.
Figure 6B:
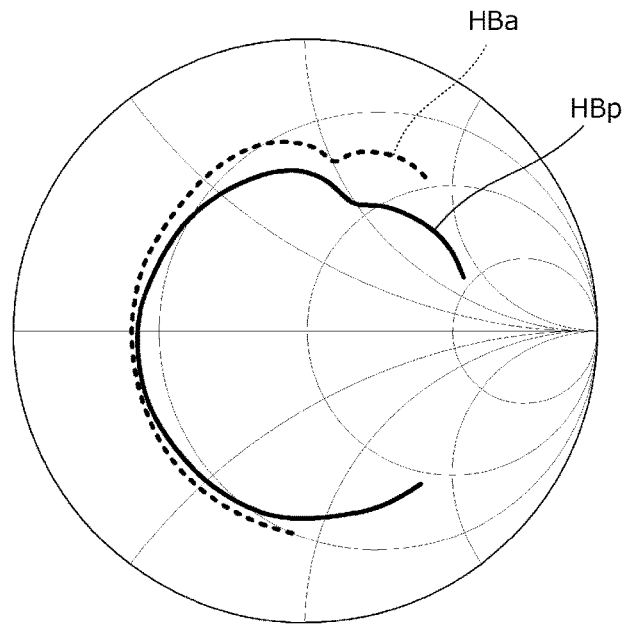

FIGS. 6A and 6B illustrate a phase-shift function of the phase shifter 11 illustrated in FIG. 4. In FIG. 6A, a locus LBa is the locus of an impedance Za illustrated in FIG. 4 in a low band, and a locus LBp is the locus of an impedance Zp illustrated in FIG. 4 in a low band. In FIG. 6B, a locus HBa is the locus of the impedance Za in a high band, and a locus HBp is the locus of the impedance Zp in a high band.

Since the phase shifter 11 preferably shifts the phase 90° or approximately 90° in a low band as illustrated in FIG. 5, the reflected signal at the position denoted by Pp in FIG. 4 is rotated by 90° or approximately 180° clockwise from the reflected signal at the position denoted by Pa. This corresponds to the impedance locus illustrated in FIG. 6A being rotated 180° or approximately 180° clockwise. Since the phase is not substantially shifted in a high band, the reflected signal viewed from Pp is the same or substantially the same as the reflected signal viewed from Pa as illustrated in FIG. 6B. In this manner, in both of the low band and the high band, the main portion (major portion) of the impedance locus is moved to the second quadrant or the third quadrant on the Smith chart. Here, "the second quadrant on the Smith chart" refers to the upper left region obtained when the Smith chart is divided into four portions in a cross-shape, the region in which the real part of the reflection coefficient is negative and the imaginary part is positive. In addition, "the third quadrant on the Smith chart" refers to the lower left region obtained when the Smith chart is divided into four portions in cross-shape, the region in which the real part of the reflection coefficient is negative and the imaginary part is negative.

The impedance matching circuit portion 41 illustrated in FIG. 4 is an autotransformer circuit including a first coil Lp and a second coil Ls that are magnetically coupled to each other. The impedance matching circuit portion 41 increases impedance viewed from the input side at a predetermined impedance conversion ratio. Accordingly, the impedance matching circuit portion 41 decreases the size of the circle of an impedance locus on a Smith chart and shifts the impedance locus clockwise.

Figure 7A:
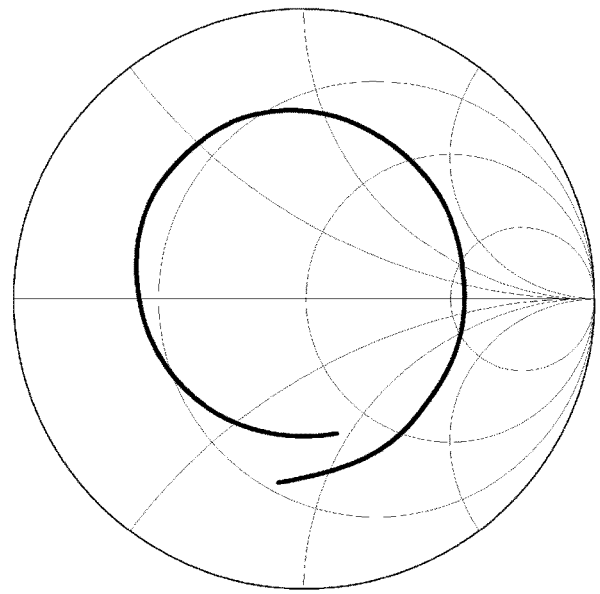
FIG. 7A illustrates the locus of an impedance Zm in FIG. 4 in a low band viewed from Pm.
Figure 7B:
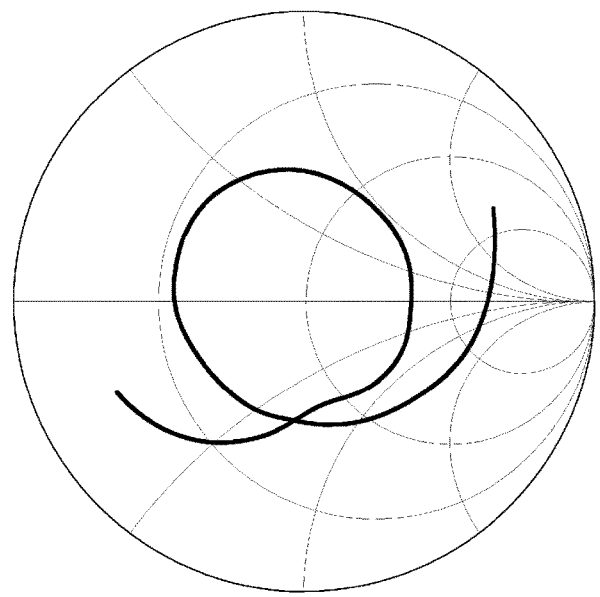
FIG. 7B illustrates the locus of the impedance Zm in a high band.

FIG. 7A illustrates the locus of an impedance Zm in a low band viewed from Pm in FIG. 4, and FIG. 7B illustrates the locus of the impedance Zm in a high band.

In this manner, in both of the low band and the high band, the impedance is moved to the second quadrant or the third quadrant on a Smith chart and then is moved toward the center of the Smith chart by the impedance matching circuit portions 41 and 42. Thus, impedance matching is performed in both of the low band and the high band.

The impedance matching circuit portion 42 changes the impedance primarily in a high band by providing a shunt-connected (parallel connected) capacitor and a series-connected inductor and changes the impedance primarily in a low band by providing a series-connected capacitor and a shunt-connected inductor.

Figure 8:
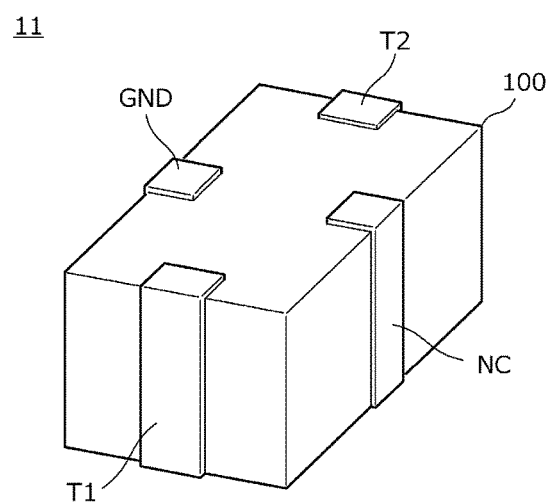
FIG. 8 is an external perspective view of the phase shifter 11.
Figure 9:
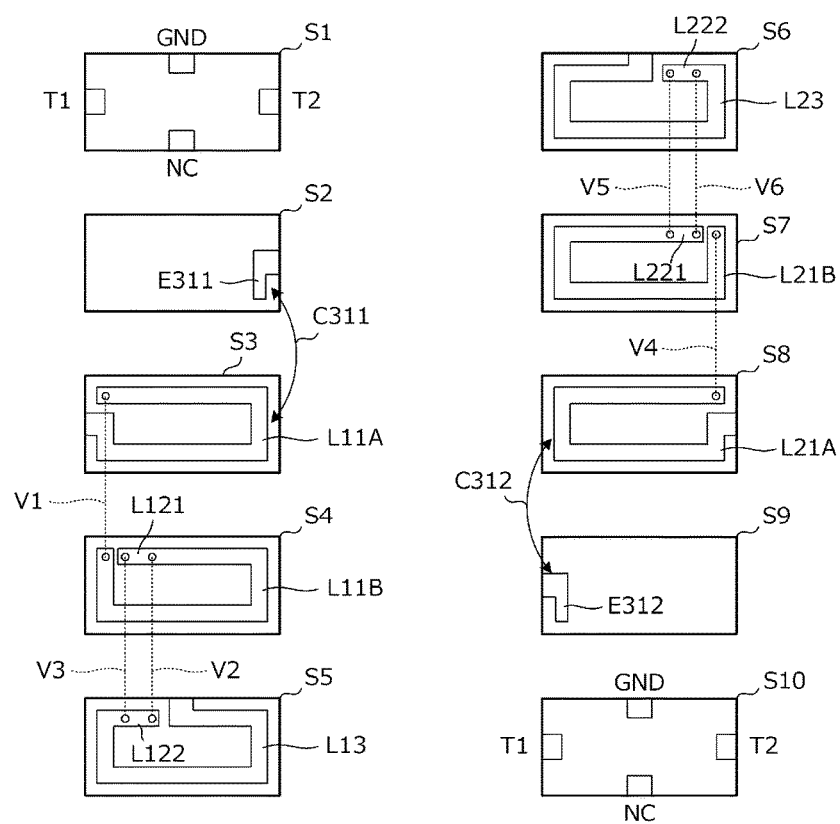
FIG. 9 is a plan view of each layer in the phase shifter 11.
Figure 10:
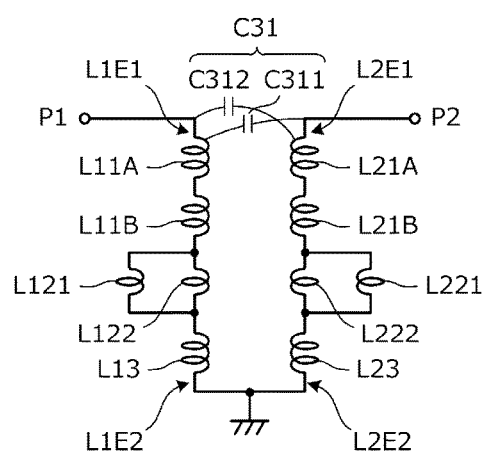
FIG. 10 is a circuit diagram of the main portion of the phase shifter 11.

FIG. 8 is an external perspective view of the phase shifter 11, and FIG. 9 is a plan view of each layer in the phase shifter 11. FIG. 10 is a circuit diagram of the main portion of the phase shifter 11.

The phase shifter 11 is structured as a surface-mounted chip component and includes a plurality of insulating bases S1 to S10. Various conductor patterns are provided on the bases S1 to S10. The phrase "various conductor patterns" refers to, not only a conductor pattern provided on the surface of a base, but also an interlayer connection conductor. The interlayer connection conductor includes, not only a via-conductor, but also an end-surface electrode provided on an end surface of a multilayer body 100.

The top surface of the base S1 corresponds to a surface (bottom surface) on which the multilayer body 100 is mounted. A terminal T1 as a first port P1, a terminal T2 as a second port P2, a ground terminal GND, and an open terminal NC are provided on the base S1.

A conductor L11A that is a loop-shaped conductor pattern is provided on the base S3. Conductors L11B and L121 are provided on the base S4. The conductors L11B and L121 are connected in series to define a loop-shaped conductor pattern. Conductors L13 and L122 are provided on the base S5. The conductors L13 and L122 are connected in series to define a loop-shaped conductor pattern. These loop-shaped conductor patterns preferably have the same or substantially the same coil axis and the same or substantially the same inside and outside diameters.

A first end of the conductor L11A is connected to the terminal T1 that defines the first port. A second end of the conductor L11A is connected to a first end of the conductor L11B via a via-conductor V1. A second end of the conductor L11B is connected to a first end of the conductor L121. The first end of the conductor L121 is connected to a first end of the conductor L122 via a via-conductor V2. A second end of the conductor L121 is connected to a second end of the conductor L122 via a via-conductor V3. That is, the conductors L121 and L122 are connected in parallel via the via-conductors V2 and V3. The second end of the conductor L122 is connected to a first end of the conductor L13. A second end of the conductor L13 is connected to the ground terminal GND. The conductors L11A, L11B, L121, L122, and L13 are an example of a "first coil conductor pattern".

A conductor L21A that is preferably a loop-shaped conductor pattern is provided on the base S8. Conductors L21B and L221 are provided on the base S7. The conductors L21B and L221 are connected in series to define a loop-shaped conductor pattern. Conductors L23 and L222 are provided on the base S6. The conductors L23 and L222 are connected in series to define a loop-shaped conductor pattern. These loop-shaped conductor patterns preferably have the same or substantially the same coil axis and the same or substantially the same inside and outside diameters.

A first end of the conductor L21A is connected to the terminal T2 that defines the second port. A second end of the conductor L21A is connected to a first end of the conductor L21B via a via-conductor V4. A second end of the conductor L21B is connected to a first end of the conductor L221. The first end of the conductor L221 is connected to a first end of the conductor L222 via a via-conductor V5. A second end of the conductor L221 is connected to a second end of the conductor L222 via a via-conductor V6. That is, the conductors L221 and L222 are connected in parallel via the via-conductors V5 and V6. The second end of the conductor L222 is connected to a first end of the conductor L23. A second end of the conductor L23 is connected to the ground terminal GND. The conductors L21A, L21B, L221, L222, and L23 are an example of a "second coil conductor pattern".

The conductors L11A, L11B, L121, L122, and L13 and via-conductors V1, V2, and V3 define the first coil L1. The conductors L21A, L21B, L221, L222, and L23 and via-conductors V4, V5, and V6 define the second coil L2. Both of the first coil L1 and the second coil L2 are preferably rectangular or substantially rectangular helical coils, for example. The coil axis direction of the first coil conductor pattern and the second coil conductor pattern is the direction in which the bases S1 to S10 are stacked.

In the first coil conductor pattern (L11A, L11B, L121, L122, and L13), the conductor L11A is a coil conductor pattern on a first end side (L1E1 in FIG. 10), and the conductor L13 is a coil conductor pattern on a second end side (L1E2 in FIG. 10). Similarly, in the second coil conductor pattern (L21A, L21B, L221, L222, and L23), the conductor L21A is a coil conductor pattern on a first end side (L2E1 in FIG. 10), and the conductor L23 is a coil conductor pattern on a second end side (L2E2 in FIG. 10). A coil opening surface on a second end side (coil opening surface of the conductor L13) of the first coil conductor pattern is preferably opposed to a coil opening surface on a second end side (coil opening surface of the conductor L23) of the second coil conductor pattern. The first coil conductor pattern and the second coil conductor pattern preferably have the same or substantially the same coil axis and the same or substantially the same inside and outside diameters.

A first capacitor electrode E311 is provided on the base S2. The first capacitor electrode E311 is electrically connected to the terminal T2 that defines the second port through a side surface of the multilayer body 100 (see FIG. 8). The first capacitor electrode E311 is partially opposed to a middle portion of the conductor L11A, and a first capacitor C311 is generated in this opposed portion. In addition, a second capacitor electrode E312 is provided on the base S9. The second capacitor electrode E312 is electrically connected to the terminal T1 that defines the first port through a side surface of the multilayer body 100 (see FIG. 8). The second capacitor electrode E312 is partially opposed to a middle portion of the conductor L21A, and a second capacitor C312 is generated in this opposed portion. That is, the first capacitor electrode E311 is disposed in an opposing manner at a position close to the first end L1E1 of the first coil conductor pattern, and the second capacitor electrode E312 is disposed in an opposing manner at a position close to the first end L2E1 of the second coil conductor pattern.

The first capacitor C311 and the second capacitor C312 are connected in parallel to each other, and the input/output additional capacitor C31 is provided. With the above-described configuration, parasitic inductance components for the input/output capacitor are decreased by half or approximately half, for example. Accordingly, the ESL (equivalent series inductance) of the input/output capacitor is decreased.

The first capacitor electrode E311 is provided along the conductor L11A. In addition, the second capacitor electrode E312 is provided along the conductor L21A. Accordingly, since the first capacitor electrode E311 and the second capacitor electrode E312 do not substantially block the coil openings of the first coil L1 and the second coil L2, the magnetic coupling between the first coil L1 and the second coil L2 is unlikely to be reduced or prevented.

The base layers in the multilayer body 100 may preferably be a non-magnetic ceramic multilayer body made of low-temperature co-fired ceramics (LTCC) or other suitable materials or a resin multilayer body made of a resin material such as polyimide or a liquid crystal polymer, for example. The base layers are preferably made of a non-magnetic material (not magnetic ferrite) as described above and, thus, is applicable to a transformer and a phase shifter having a predetermined inductance and a predetermined coupling coefficient even in a high-frequency band over the ultra high frequency (UHF) band.

The above-described conductor patterns and interlayer connection conductors are preferably made of, for example, a conductor material including Ag or Cu as a main component and having a low resistivity. If the base layers are ceramics, for example, the conductor patterns and interlayer connection conductors are preferably formed by screen printing and firing of conductive paste including Ag or Cu as a main component. If the base layers are resin, for example, the conductor patterns and interlayer connection conductors are patterned by etching a metal foil, such as an Al foil or a Cu foil.

Figure 11A:
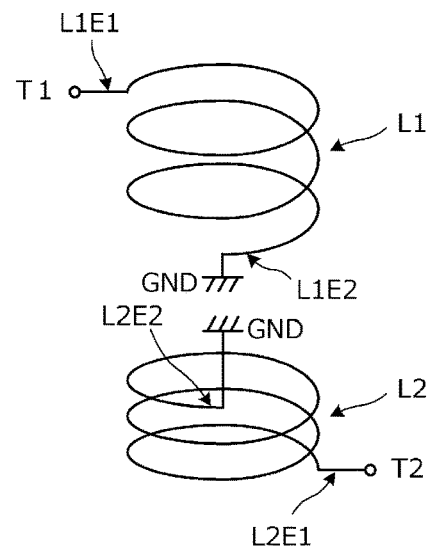
FIG. 11A is a schematic view of a positional relationship between a first end and a second end of each of a first coil L1 and a second coil L2 in the phase shifter 11 in a state in which the first coil L1 and the second coil L2 are stacked.
Figure 11B:
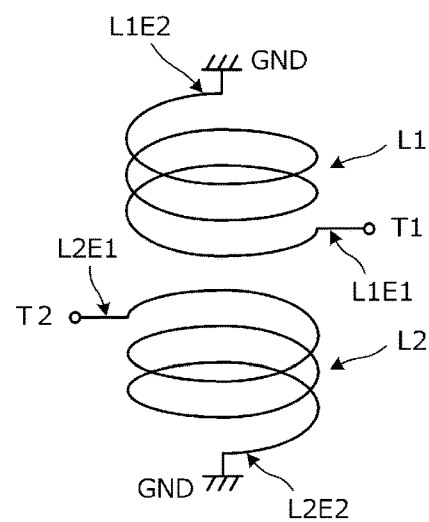
FIG. 11B is a schematic view of a positional relationship between the first end and the second end of each of the first coil L1 and the second coil L2 in a phase shifter as a comparative example in a state in which the first coil L1 and the second coil L2 are stacked.

FIG. 11A is a schematic view of a positional relationship between the first end and the second end of each of the first coil L1 and the second coil L2 in the phase shifter 11 in a state in which the first coil L1 and the second coil L2 are stacked. FIG. 11B is a schematic view of a positional relationship between the first end and the second end of each of the first coil L1 and the second coil L2 in a phase shifter as a comparative example in a state in which the first coil L1 and the second coil L2 are stacked.

In the phase shifter 11 according to the present preferred embodiment, as described above, the coil opening surface of the first coil L1 on the second end L1E2 side (connected to the ground terminal GND) is opposed to the coil opening surface of the second coil L2 on the second end L2E2 side (connected to the ground terminal GND). As the distance between the coils is decreased, typically, the coupling coefficient k is increased. However, the capacitance of the input/output capacitor C3 (see FIG. 3) is also increased. In contrast, in the structure according to the present preferred embodiment, the first ends L1E1 and L2E1 connected to the terminals T1 and T2 are disposed at the most distant positions. Thus, the absolute value of the capacitance of the input/output capacitor C3 itself is small, and because of the distance between the coils, the change in the value is small. That is, this structure enables independent control of the coupling coefficient k and the input/output capacitor C3. The coupling coefficient k is able to be adjusted by the distance between the coils, and the input/output capacitor C3 is able to be adjusted by the input/output additional capacitor C31.

Thus, a predetermined phase-shift characteristic is able to be obtained while having a frequency characteristic.

Second Preferred Embodiment

A second preferred embodiment of the present invention will describe an example of a phase shifter including an input additional capacitor and an output additional capacitor.

Figure 12:
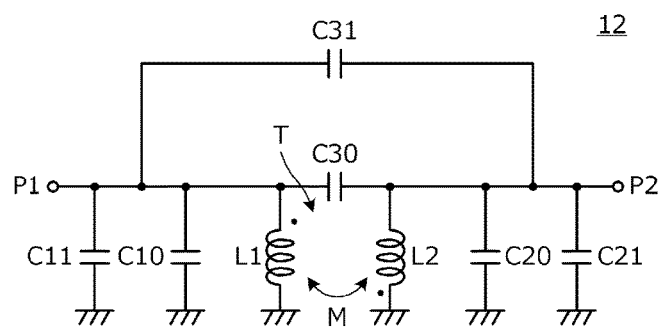
FIG. 12 is a circuit diagram of a phase shifter 12 according to a second preferred embodiment of the present invention.

FIG. 12 is a circuit diagram of a phase shifter 12 according to the second preferred embodiment. The phase shifter 12 is different from the phase shifter 11 illustrated in FIG. 1 in the first preferred embodiment in that it further includes an input additional capacitor C11 and an output additional capacitor C21.

In FIG. 12, the input additional capacitor C11 is connected in parallel to the first coil L1, and the output additional capacitor C21 is connected in parallel to the second coil L2. Accordingly, the input additional capacitor C11 is connected in parallel to the first coil capacitor C10, and the output additional capacitor C21 is connected in parallel to the second coil capacitor C20.

Figure 13:
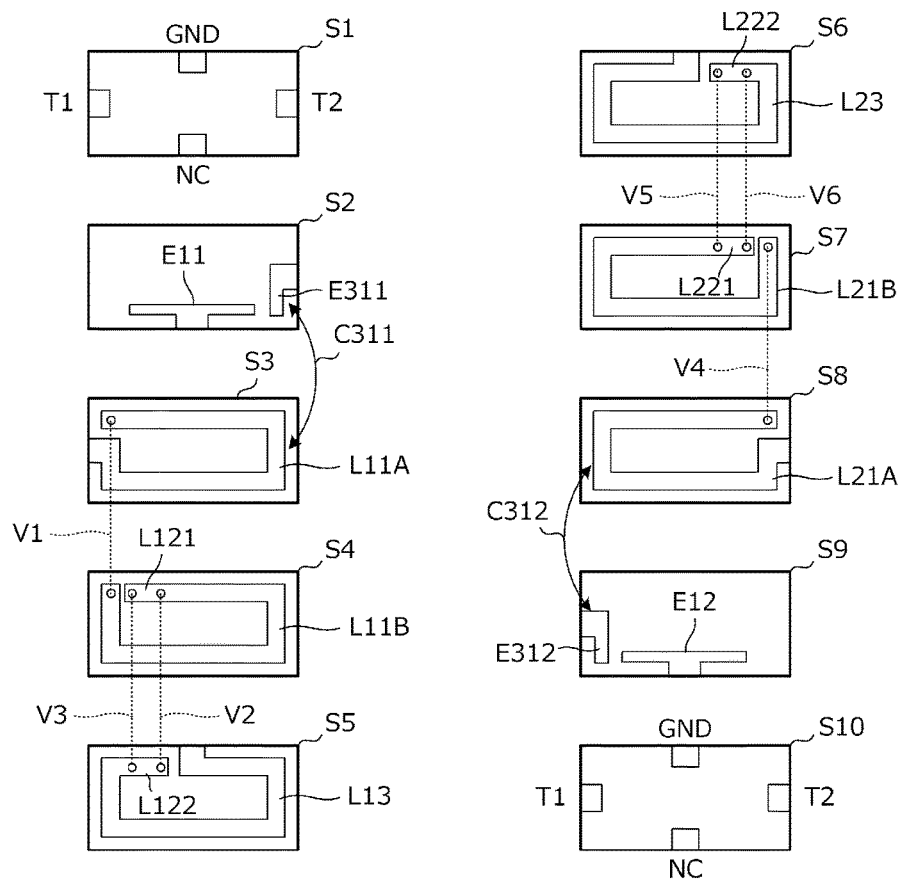
FIG. 13 is a plan view of each layer in the phase shifter 12.
Figure 14:
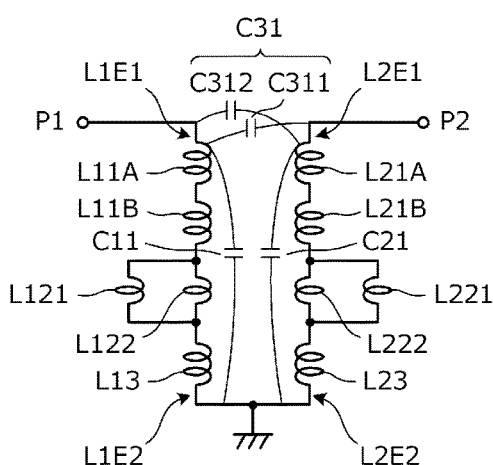
FIG. 14 is a circuit diagram of the main portion of the phase shifter 12.

FIG. 13 is a plan view of each layer in the phase shifter 12. FIG. 14 is a circuit diagram of the main portion of the phase shifter 12.

As illustrated in FIG. 13, an input capacitor electrode E11 is provided on the base S2, and an output capacitor electrode E21 is provided on the base S9. The input capacitor electrode E11 is electrically connected to the ground terminal GND through a side surface of the multilayer body. The output capacitor electrode E21 is electrically connected to the ground terminal GND through a side surface of the multilayer body. The input additional capacitor C11 is generated in a portion where the input capacitor electrode E11 and the conductor L11A are opposed to each other. In addition, the output additional capacitor C21 is generated in a portion where the output capacitor electrode E21 and the conductor L21A are opposed to each other. The remaining configuration is the same or substantially the same as that of the phase shifter 11 illustrated in the first preferred embodiment.

According to the present preferred embodiment, a predetermined input capacitor is able to be obtained without narrowing the conductor pattern interval of the first coil conductor pattern that defines the first coil L1. In addition, a predetermined output capacitor is able to be obtained without narrowing the conductor pattern interval of the second coil conductor pattern that defines the second coil L2. Accordingly, the degree of freedom for designing the coupling coefficient between the first coil L1 and the second coil L2 is increased. Furthermore, the input capacitor and the output capacitor are provided on a single insulating base together with the transformer, and accordingly, a compact phase shifter with a simple structure is provided.

Third Preferred Embodiment

Figure 15:
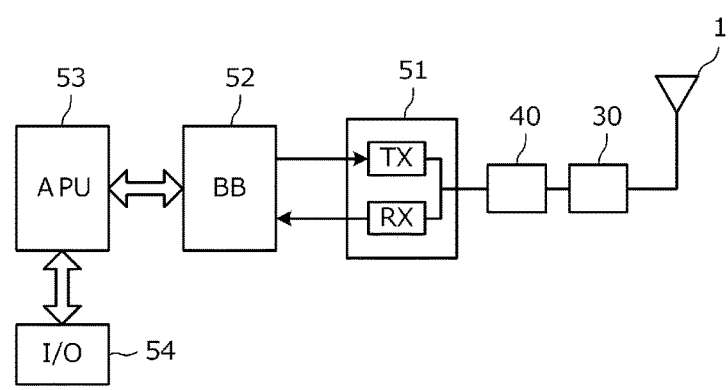
FIG. 15 is a block diagram of a communication terminal apparatus 200 according to a third preferred embodiment of the present invention.
Figure 16A:
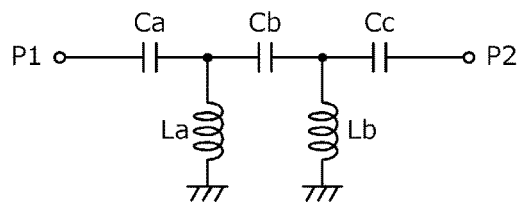
FIG. 16A is a circuit diagram of a high-pass-filter-type phase shifter.
Figure 16B:
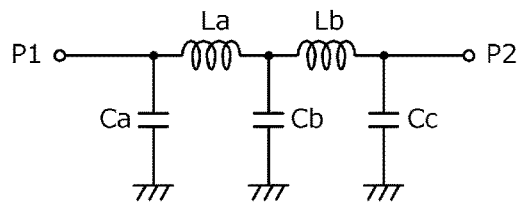
FIG. 16B is a circuit diagram of a low-pass-filter-type phase shifter.
Figure 17:
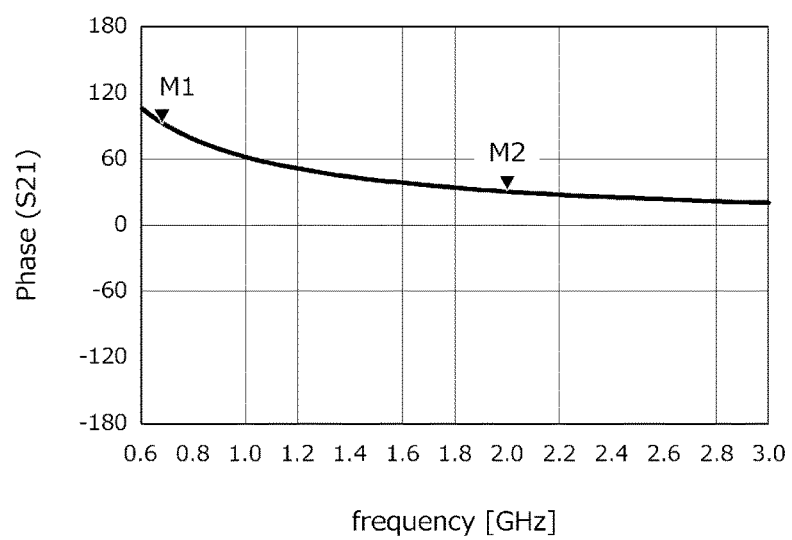
FIG. 17 illustrates an example of a phase-frequency characteristic of a high-pass-filter-type phase shifter illustrated in FIG. 16A.
Figure 18:
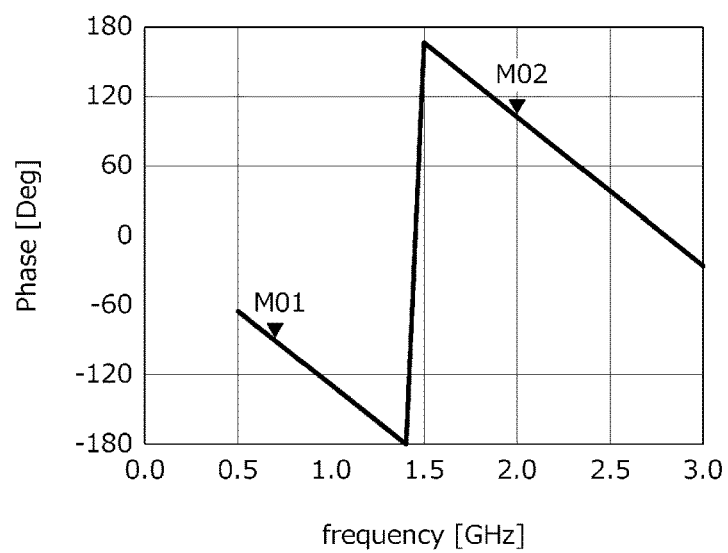
FIG. 18 illustrates an example of a phase-frequency characteristic of a low-pass-filter-type phase shifter illustrated in FIG. 16B.
Figure 19:
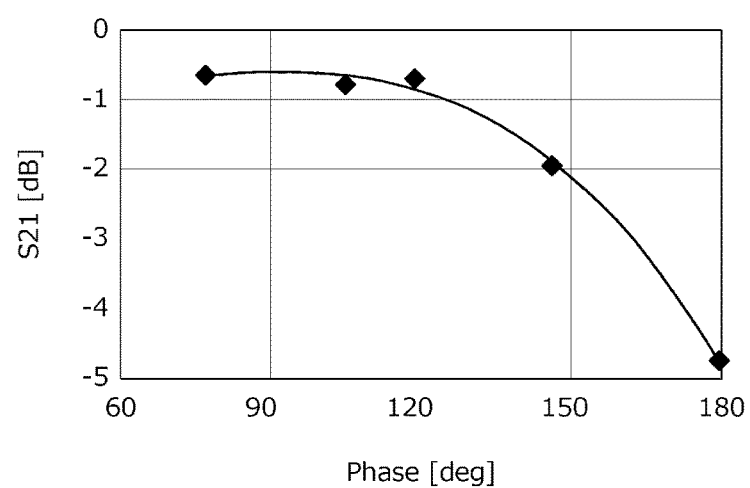
FIG. 19 illustrates an example of an insertion-loss characteristic with respect to the phase of the high-pass-filter-type phase shifter illustrated in FIG. 16A.
Figure 20:
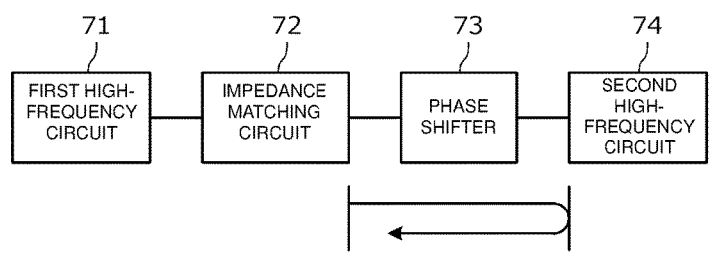
FIG. 20 illustrates an example of a circuit configuration for impedance matching between a first high-frequency circuit 71 and a second high-frequency circuit 74.

A third preferred embodiment of the present invention will describe a communication terminal apparatus. FIG. 15 is a block diagram of a communication terminal apparatus 200 according to the third preferred embodiment. The communication terminal apparatus 200 according to the present preferred embodiment includes the antenna 1, an antenna matching circuit 40, a phase-shift circuit 30, a communication circuit 51, a baseband circuit 52, an application processor 53, and an input/output circuit 54. The communication circuit 51 includes a transmission circuit and a reception circuit for a low band (about 700 MHz to about 1.0 GHz)

and a high band (about 1.4 GHz to about 2.7 GHz) and an antenna duplexer. The antenna 1 is preferably, for example, a monopole antenna, an inverse L antenna, an inverse F antenna, or other antenna that is compatible with the low band and the high band.

The above-described components are preferably disposed in a single housing. For example, the antenna matching circuit 40, the phase-shift circuit 30, the communication circuit 51, the baseband circuit 52, and the application processor 53 are mounted on a printed wiring board, and the printed wiring board is stored in the housing. The input/output circuit 54 is incorporated in the housing as a display and touch panel. The antenna 1 is mounted on the printed wiring board or disposed on an inner wall of the housing or inside the housing.

The communication terminal apparatus having the above-described configuration and including an antenna that performs matching in a wide band is obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A phase shifter comprising:
   a transformer connected between a first port and a second port and including a first coil, a second coil that is magnetically coupled to the first coil, and a parasitic inductance component; and
   an impedance adjustment circuit including a reactance element connected to the transformer; wherein
   a coupling coefficient between the first coil and the second coil of the transformer and a value of the reactance element in the impedance adjustment circuit cause a phase-shift amount to change in accordance with a frequency band; and
   the impedance adjustment circuit includes an input/output capacitor connected between the first port and the second port of the transformer, the input/output capacitor being defined by an inter-coil capacitance generated between the first coil and the second coil and an input/output additional capacitor connected between the first port and the second port.

2. The phase shifter according to claim 1, wherein the coupling coefficient between the first coil and the second coil is less than or equal to about 0.9.

3. The phase shifter according to claim 1, wherein
   the first coil is connected between the first port and a ground; and
   the second coil is connected between the second port and the ground.

4. The phase shifter according to claim 1, wherein the first coil and the second coil have a same or substantially a same coil axis and coil opening surfaces that are opposed to each other.

5. The phase shifter according to claim 1, wherein the first coil and the second coil have same or substantially same inside and outside diameters.

6. A communication terminal apparatus comprising:
   a feeder circuit; and
   an antenna connected to the feeder circuit; wherein
   between the feeder circuit and the antenna, the phase shifter according to claim 1 is provided.

7. The communication terminal apparatus according to claim 6, wherein
   the transformer includes an insulating base, a first input/output electrode defining the first port, a second input/output electrode defining the second port, a ground electrode, a first coil conductor pattern, and a second coil conductor pattern that are provided on the insulating base;
   the first coil conductor pattern defines the first coil and includes a first end connected to the first input/output electrode and a second end connected to the ground electrode;
   the second coil conductor pattern defines the second coil and includes a first end connected to the second input/output electrode and a second end connected to the ground electrode; and
   the input/output additional capacitor is provided on the insulating base and includes a first capacitor electrode that generates a capacitance between the first coil conductor pattern and the second input/output electrode.

8. The phase shifter according to claim 1, wherein
   the transformer includes an insulating base, a first input/output electrode defining the first port, a second input/output electrode defining the second port, a ground electrode, a first coil conductor pattern, and a second coil conductor pattern that are provided on the insulating base;
   the first coil conductor pattern defines the first coil and includes a first end connected to the first input/output electrode and a second end connected to the ground electrode;
   the second coil conductor pattern defines the second coil and includes a first end connected to the second input/output electrode and a second end connected to the ground electrode; and
   the input/output additional capacitor is provided on the insulating base and includes a first capacitor electrode that generates a capacitance between the first coil conductor pattern and the second input/output electrode.

9. The phase shifter according to claim 8, wherein
   at least one of the first coil conductor pattern and the second coil conductor pattern is a helical coil conductor pattern including a plurality of turns;
   a coil opening surface of the first coil conductor pattern on a side of the second end is opposed to a coil opening surface of the second coil conductor pattern on a side of the second end; and
   the first capacitor electrode is disposed in an opposing arrangement at a position close to the first end of the first coil conductor pattern.

10. The phase shifter according to claim 8, wherein the first capacitor electrode is provided along the first coil conductor pattern.

11. The phase shifter according to claim 8, wherein
    the insulating base is a multilayer body including a plurality of insulating layers that are stacked; and
    a coil axis direction of the first coil conductor pattern and the second coil conductor pattern is a direction in which the plurality of insulating layers are stacked.

12. The phase shifter according to claim 8, wherein
    the input/output additional capacitor is provided on the insulating base;
    a second capacitor electrode to generate a capacitance between the second coil conductor pattern and the first input/output electrode is provided; and the second capacitor electrode is disposed in an opposing arrangement at a position close to the first end of the second coil conductor pattern.

13. The phase shifter according to claim 12, wherein the second capacitor electrode is provided along the second coil conductor pattern.

14. The phase shifter according to claim 8, further comprising:
an input capacitor connected between the first port of the transformer and a ground; wherein
the input capacitor is provided on the insulating base, connected to the ground electrode, and defined by an input capacitor electrode that generates a capacitance between the input capacitor electrode and the first coil conductor pattern and a capacitance generated in the first coil conductor pattern.

15. The phase shifter according to claim 14, further comprising:
an output capacitor connected between the second port of the transformer and the ground; wherein
the output capacitor is provided on the insulating base, connected to the ground terminal, and defined by an output capacitor electrode that generates a capacitance between the output capacitor electrode and the second coil conductor pattern and a capacitance generated in the second coil conductor pattern.

16. An impedance matching circuit device comprising:
the phase shifter according to claim 1; and
an impedance matching circuit that is connected in series to the phase shifter; wherein
the impedance matching circuit matches an impedance with a phase that has been shifted by the phase shifter.

17. The impedance matching circuit device according to claim 16, wherein
the phase shifter moves impedance in a low band to a second quadrant or a third quadrant on a Smith chart; and
the impedance matching circuit moves both impedance in a high band and the impedance in the low band toward a center of the Smith chart.

18. The impedance matching circuit device according to claim 16, wherein
the transformer includes an insulating base, a first input/output electrode defining the first port, a second input/output electrode defining the second port, a ground electrode, a first coil conductor pattern, and a second coil conductor pattern that are provided on the insulating base;
the first coil conductor pattern defines the first coil and includes a first end connected to the first input/output electrode and a second end connected to the ground electrode;
the second coil conductor pattern defines the second coil and includes a first end connected to the second input/output electrode and a second end connected to the ground electrode; and
the input/output additional capacitor is provided on the insulating base and includes a first capacitor electrode that generates a capacitance between the first coil conductor pattern and the second input/output electrode.

19. A communication terminal apparatus comprising:
a feeder circuit; and
an antenna connected to the feeder circuit; wherein
between the feeder circuit and the antenna, the impedance matching circuit according to claim 16 is provided.

20. The communication terminal apparatus according to claim 19, wherein
the transformer includes an insulating base, a first input/output electrode defining the first port, a second input/output electrode defining the second port, a ground electrode, a first coil conductor pattern, and a second coil conductor pattern that are provided on the insulating base;
the first coil conductor pattern defines the first coil and includes a first end connected to the first input/output electrode and a second end connected to the ground electrode;
the second coil conductor pattern defines the second coil and includes a first end connected to the second input/output electrode and a second end connected to the ground electrode; and
the input/output additional capacitor is provided on the insulating base and includes a first capacitor electrode that generates a capacitance between the first coil conductor pattern and the second input/output electrode.

* * * * *